(12) United States Patent
Kwon et al.

(10) Patent No.: US 7,692,381 B2
(45) Date of Patent: Apr. 6, 2010

(54) ORGANIC LIGHT EMITTING DISPLAY DEVICE WITH A METAL SUBSTRATE AND METHOD FOR FABRICATING THE SAME

(75) Inventors: Se Yeoul Kwon, Yongin-si (KR); Hyun Soo Shin, Yongin-si (KR); Jae Kyeong Jeong, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 541 days.

(21) Appl. No.: 11/638,792

(22) Filed: Dec. 14, 2006

(65) Prior Publication Data

US 2007/0188087 A1 Aug. 16, 2007

(30) Foreign Application Priority Data

Feb. 10, 2006 (KR) .................. 10-2006-0013150

(51) Int. Cl.
*H01J 1/62* (2006.01)
(52) U.S. Cl. .................. 313/506; 428/690; 313/504
(58) Field of Classification Search ......... 313/498–512; 428/690; 445/49–51
See application file for complete search history.

(56) References Cited

U.S. PATENT DOCUMENTS 6,602,753 B2 * 8/2003 Koyama et al. .............. 438/287

2002/0030440 A1 * 3/2002 Yamazaki .................. 313/503

FOREIGN PATENT DOCUMENTS

| JP | 08-236479 | 9/1996 |
| JP | 10-242078 | 9/1998 |
| JP | 2000-029057 | 1/2000 |
| JP | 2002-117971 | 4/2002 |
| JP | 2002-184978 | 6/2002 |
| JP | 2004-354648 | 12/2004 |
| KR | 10-2001-0030363 | 4/2001 |
| KR | 10-2005-0066645 | 6/2005 |

OTHER PUBLICATIONS

Korean Office Action issued Jan. 30, 2007 to the corresponding Korean patent Application No. 10-2006-0013150.

\* cited by examiner

*Primary Examiner*—Joseph L Williams
(74) *Attorney, Agent, or Firm*—Knobbe Martens Olson & Bear LLP

(57) ABSTRACT

An organic light emitting display device which can prevent separation of a buffer layer, thereby reducing an electrical short is disclosed. One embodiment of the organic light emitting display device includes a substrate made of a metal, a metal thin film formed on the substrate, a buffer layer formed on the metal thin film, and an organic light emitting diode formed on the buffer layer. Accordingly, a leakage current caused by an electrical short can be effectively prevented by preventing the separation of the buffer layer.

20 Claims, 2 Drawing Sheets

ORGANIC LIGHT EMITTING DISPLAY DEVICE WITH A METAL SUBSTRATE AND METHOD FOR FABRICATING THE SAME

CROSS-REFERENCE TO RELATED APPLICATION

This application claims the benefit of Korean Patent Application No. 10-2006-0013150, filed on Feb. 10, 2006, in the Korean Intellectual Property Office, the disclosure of which is incorporated herein by reference.

BACKGROUND

1. Field

The instant disclosure relates to a display device, and a method of fabricating the same, and more particularly to an organic light emitting display device and a method for fabricating the same.

2. Description of the Related Technology

An organic light emitting display (OLED) device is a type of flat panel display which emits light using a layer of an organic material. An OLED device includes two electrodes and an organic light emitting layer interposed between the electrodes. When a voltage is applied between the electrodes, one of the electrodes injects holes into the light emitting layer whereas the other injects electrons into the light emitting layer. The holes and electrons recombine with each other in the light emitting layer, thereby generating excitons having an excited energy state. The excitons, while returning to the ground state, discharge energy, thereby emitting light.

An OLED device has an excellent light emitting efficiency, brightness, and viewing angle. An OLED device also has a short response time, a slim profile, and a light-weight. Thus, it has drawn attention as a next generation display device.

Recently, portable display devices have been actively developed. Accordingly, researches have focused on developing flexible and thin organic light emitting display devices. Accordingly, there has been a need to provide a substrate which can have both flexibility and heat-resistance while having a slim profile.

Certain organic light emitting display devices include a metal substrate made of, for example, SUS (Steel Special Use Stainless). Such a metal substrate typically has hardness stronger than that of a glass, and is not easily damaged even with a thin thickness. A metal substrate also has flexibility and heat-resistance. Thus, it has drawn attention as a substrate suitable for a flexible organic light emitting display device.

SUMMARY

One embodiment provides an organic light emitting display device, comprising: a substrate formed of a metal; a metal thin film formed on the substrate; a buffer layer formed on the metal thin film; and an organic light emitting diode formed over the buffer layer.

The substrate may be formed of a first metal, and the metal thin film may be formed of a second metal. The first metal may be different from the second metal. The substrate may be formed of SUS. The buffer layer may comprise at least one of a nitride layer and an oxide layer. The metal thin film may be formed of at least one selected from the group consisting of molybdenum (Mo), tungsten (W), a molybdenum-tungsten alloy (MoW), titanium (Ti), tantalum (Ta), invar (FeNi), cobalt (Co), palladium (Pd), chrome (Cr), and an alloy of one or more of the foregoing.

The substrate may comprise a surface contacting the metal thin film, and the substrate may comprise at least one protrusion on the surface. The metal thin film may comprise a surface contacting the buffer layer, and the surface of the metal thin film may be substantially planar. The metal thin film may have a thickness of about 0.1 μm to about 1 μm.

The substrate may have a first thermal expansion coefficient, and the buffer layer may have a second thermal expansion coefficient. The metal thin film may have a third thermal expansion coefficient between the first and second thermal expansion coefficients. The third thermal expansion coefficient of the metal thin film may be about $1 \times 10^{-6}$ to about $13 \times 10^{-6}/°$ C. The first thermal expansion coefficient may be about $16 \times 10^{-6}$ to about $18 \times 10^{-6}/°$ C.

Another embodiment provides a method for fabricating an organic light emitting display device, the method comprising: forming a metal thin film on a substrate formed of a metal; forming a buffer layer on the metal thin film; and forming an organic light emitting diode over the buffer layer.

The substrate may be formed of a first metal, and the metal thin film may be formed of a second metal. The first metal may be different from the second metal. The substrate may be formed of SUS. The metal thin film may be formed of at least one selected from the group consisting of molybdenum (Mo), tungsten (W), a molybdenum-tungsten alloy (MoW), titan (Ti), tantalum (Ta), invar (FeNi), cobalt (Co), palladium (Pd), chrome (Cr), and an alloy of one or more of the foregoing. The metal thin film may have a thickness of about 0.1 μm to about 1 μm. The metal thin film may be formed by sputtering deposition or chemical vapor deposition.

The method may further comprise planarizing a top surface of the substrate before forming the metal thin film on the top surface of the substrate. Planarizing the top surface may comprise using a chemical mechanical polishing or super milling process. The method may further comprise forming a thin film transistor or a wire over the buffer layer.

Another embodiment provides an organic light emitting display device which can prevent separation of a buffer layer and reduce an electrical short and a method for fabricating the organic light emitting display device.

Yet another embodiment provides an organic light emitting display device comprising: a substrate made of a metal; a metal thin film formed on the substrate; a buffer layer formed on the metal thin film; and an organic light emitting diode formed on the buffer layer.

The substrate may be made of SUS. The metal thin film may be formed of at least one selected from the group consisting of molybdenum (Mo), tungsten (W), a molybdenum-tungsten alloy (MoW), titanium (Ti), tantalum (Ta), invar (FeNi), cobalt (Co), palladium (Pd), chromium (Cr), and an alloy of one or more of the foregoing. The metal thin film has a thickness of about 0.1 μm to about 1 μm. The thermal expansion coefficient of the metal thin film is a value between the thermal expansion coefficients of the substrate and the buffer layer.

Another embodiment provides a method for fabricating an organic light emitting display device, the method comprising the steps of: forming a metal thin film on a substrate formed of a metal; forming a buffer layer on the metal thin film; and forming an organic light emitting diode on the buffer layer.

The substrate may be made of SUS. The metal thin film is formed of at least one selected from a group consisting of molybdenum (Mo), tungsten (W), a molybdenum-tungsten alloy (MoW), titanium (Ti), tantalum (Ta), invar (FeNi), cobalt (Co), palladium (Pd), chromium (Cr), and an alloy of one or more of the foregoing. The metal thin film has a thickness of about 0.1 μm to about 1 μm. The metal thin film is formed by sputtering or chemical vapor deposition. The method further comprises the step of forming a thin film transistor or a wire on the buffer layer.

BRIEF DESCRIPTION OF THE DRAWINGS

These and/or other aspects and advantages of the instant disclosure will become apparent and more readily appreciated from the following description of certain embodiments, taken in conjunction with the accompanying drawings of which.

DETAILED DESCRIPTION OF CERTAIN EMBODIMENTS

Hereinafter, certain embodiments according to the instant disclosure will be described in detail with reference to FIGS. 2 to 4.

In making an OLED device having a metal substrate, because a surface of a metal substrate is typically coarse, it needs to be planarized, using a suitable planarization process such as a CMP (Chemical Mechanical Polishing) process, prior to forming devices such as a thin film transistor (hereinafter, referred to as a TFT) or wires on the metal substrate. However, even after the planarization process has been performed, the surface of the metal substrate may not be completely planar and may have protrusions thereon. The protrusions may have a height of about 1000 to about 5000 Å.

Figure 1:
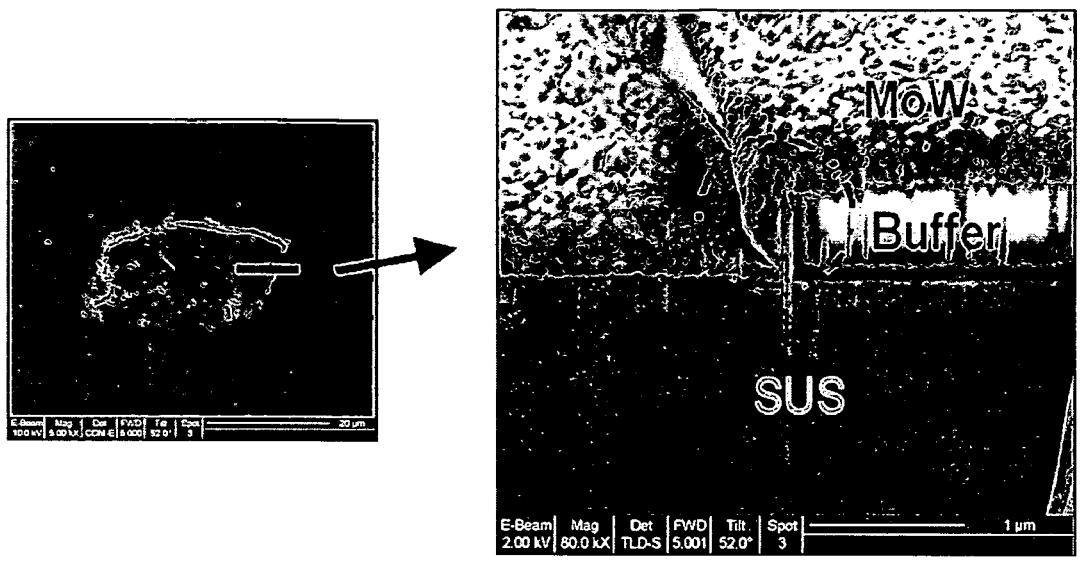
FIG. 1 is a micrograph, taken with a scanning electron microscope, of a partially fabricated organic light emitting display device having an electrical short between a metal substrate and a conductive layer due to partial separation of a buffer layer.

In this case, a buffer layer may be formed on the metal substrate. The protrusions, however, may cause the buffer layer to be partially separated from the substrate during a subsequent process (e.g., a cleaning process). If a conductive layer for forming a TFT or wires is formed on the partially separated buffer layer, as shown in FIG. 1, the metal substrate and the conductive layer may be electrically connected to each other, thereby causing an electrical short.

Further, a difference between the thermal expansion coefficients of the metal substrate and the buffer layer may be large. Thus, the adhesion between the metal substrate and the buffer layer may be weak even at portions of the metal substrate which have no protrusions. Thus, partial separation of the buffer layer may occur due to a pressure or heat applied from the outside. An electrical short caused when the buffer layer is separated from the substrate increases a leakage current in the organic light emitting display device.

Therefore, in the organic light emitting display device including a metal substrate, there is a need to improve the leakage current characteristics by enhancing the adhesion between the metal substrate and the buffer layer and preventing the separation of the buffer layer from the metal substrate.

Figure 2:
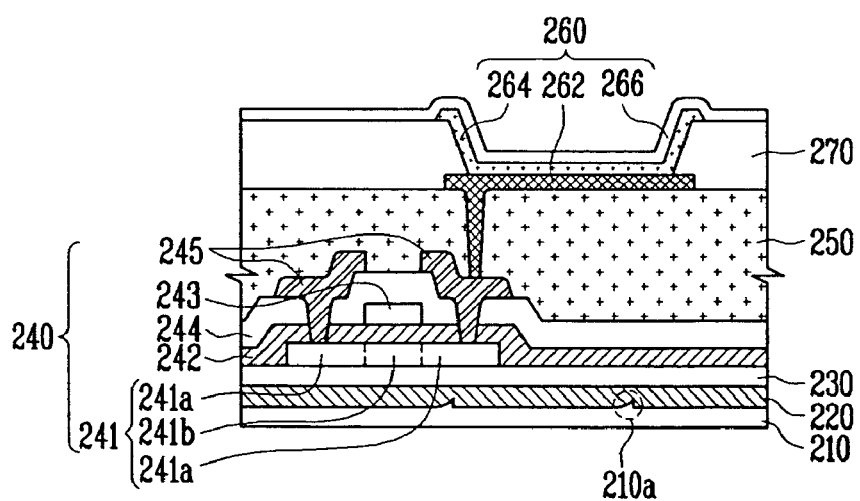
FIG. 2 is a cross-sectional view of an organic light emitting display device according to an embodiment.

FIG. 2 is a cross-sectional view showing an organic light emitting display (OLED) device according to an embodiment. Although FIG. 2 shows a pixel of the organic light emitting display device including at least one thin film transistor and an organic light emitting diode connected to the thin film transistor, the present disclosure is not limited thereto.

Referring to FIG. 2, the organic light emitting display device according to the embodiment includes a substrate 210, a metal thin film 220 formed on the substrate 210, a buffer layer 230 formed on the metal thin film 220, a thin film transistor 240 formed on the buffer layer 230, and an organic light emitting diode 260 connected to the thin film transistor 240.

The substrate 210 may be made of a metal such as SUS (Steel Special Use Stainless). The substrate 210 made of a metal is not easily damaged even if it has a thin thickness due to its hardness stronger than that of a glass substrate. The metal substrate is also suitable for a flexible display due to its flexibility and heat-resisting property. Here, a planarization process such as a CMP process and a super milling process is performed on the substrate 210 prior to forming devices, wires, and the like over the substrate 210.

The buffer layer 230 is formed of at least one layer such as a nitride layer and an oxide layer. The buffer layer 230 absorbs stresses between the substrate 210 and the devices or the wires. An exemplary device is a thin film transistor 240. Further, in one embodiment in which the substrate 210 is formed of a conductive material such as a metal, the buffer layer 230 is formed to prevent an electrical short between the substrate 210 and the devices or the wires. For this, the buffer layer 230 is formed between the substrate 210 and the devices or the wires. However, the buffer layer 230 may be partially separated from the substrate 210 due to protrusions 210a which may remain on the substrate 210 even after the planarization process. In certain cases, a difference between the thermal expansion coefficients of the substrate 210 and the buffer layer 230 may also cause the buffer layer 230 to be separated from the substrate 210. In this case, if a conductive device or a wire is formed over a portion where the buffer layer 230 is separated from the substrate 210, an electrical short can occur between the substrate 210 and the devices or the wires, thereby generating a leakage current.

In order to prevent this problem, in one embodiment, the OLED device includes a metal thin film 220 formed of at least one selected from the group consisting of molybdenum (Mo), tungsten (W), a molybdenum-tungsten alloy (MoW), titanium (Ti), tantalum (Ta), invar (FeNi), cobalt (Co), palladium (Pd), chromium (Cr), and an alloy of one or more of the foregoing. The metal thin film 220 may have a thickness of about 0.1 to about 1 μm. The metal thin film 220 is interposed between the metal substrate 210 and the buffer layer 230.

The thermal expansion coefficient of the metal thin film 220 is a value between the thermal expansion coefficients of the substrate 210 and the buffer layer 230. Thus, the metal thin film 220 absorbs the difference between the thermal expansion coefficients of the substrate 210 and the buffer layer 230 during a heat treatment process. For example, in one embodiment in which the substrate 210 is made of SUS (a stainless steel grade SUS304), the thermal expansion coefficient of the substrate 210 is about $16 \times 10^{-6}$ to about $18 \times 10^{-6}/°C$. and the thermal expansion coefficient of the metal thin film 220 formed of at least one of the above-mentioned materials is about $1 \times 10^{-6}$ to about $13 \times 10^{-6}/°C$. The buffer layer 230 may have a thermal expansion coefficient of about $0.5 \times 10^{-6}/°C$. to about $8 \times 10^{-6}/°C$. Thus, the metal thin film 220 absorbs stresses between the substrate 210 and the buffer layer 230 during the heat treatment process, thereby enhancing the adhesion between the substrate 210 and the buffer layer 230.

In one embodiment, the metal thin film 220 may be formed of titanium (Ti) which has excellent adhesive characteristics. Thus, the adhesion between the substrate 210 and the buffer layer 230 can be reinforced effectively. Further, the metal thin film 220 smoothly covers the protrusions 210a of the substrate 210, which remain even after the planarization process. The metal thin film 220 facilitates forming the buffer layer 230, and prevents separation of the buffer layer 230. Here, materials of the metal thin film 220 is not limited to the above-mentioned materials, and any other materials which can be located between the substrate 210 and the buffer layer 230 to reinforce the adhesion between the substrate 210 and the buffer layer 230 can be used.

The thin film transistor 240 is formed over the buffer layer 230. The thin film transistor 240 includes a semiconductor layer 241 having source and drain regions 241a and a channel region 241b, a gate insulation layer 242 formed on the semiconductor layer 241, a gate electrode 243 formed on the gate insulation layer 242, an interlayer insulation layer 244 formed on the gate electrode 243, and source and drain electrodes 245 formed on the interlayer insulation layer 244 and electrically connected to the source and drain regions 241a. Here, although the thin film transistor 240 has a top-gate structure, it can have various structures such as a bottom-gate structure.

A planarization layer 250 having a via hole for exposing at least one portion of the drain electrode 245 is formed on the thin film transistor 240. Further, the organic light emitting diode 260 connected to the thin film transistor 240 through the via hole is provided on the planarization layer 250. The organic light emitting diode 260 includes first and second electrodes 262 and 266 and an organic light emitting layer 264 located between the first and second electrodes 262 and 266. Here, the first electrode 262 is formed on the planarization layer 250 and is connected to the drain electrode 245 of the thin film transistor 240 through the via hole. A pixel definition layer 270 having an opening exposing at least one portion of the first electrode is formed on the first electrode 262 and the organic light emitting layer 264 is formed in the opening of the pixel definition layer 270. The second electrode 266 is formed on the organic light emitting layer 264. The organic light emitting diode 260 generates light of a predetermined brightness in response to a current supplied from the thin film transistor 240.

In the above-mentioned organic light emitting display device, the metal thin film 220 provided between the substrate 210 and the buffer layer 230 smoothly covers the surface of the substrate 210 and absorbs the difference between the thermal expansion coefficients of the substrate 210 and the buffer layer 230, thereby absorbing the stress. Due to the metal thin film 220, the adhesion between the substrate 210 and the buffer layer 230 is reinforced to prevent the separation of the buffer layer 230. Therefore, the metal thin film 220 prevents an electrical short which can occur between the substrate 210 and the thin film transistor 240, thereby preventing generation of a leakage current. In other embodiments where wires such as scanning lines and data lines are formed over the buffer layer 230, the metal thin film 220 may also prevent separation of the buffer layer 230, thereby preventing a leakage current which can occur between the substrates 210 and the wires.

Figure 3A:
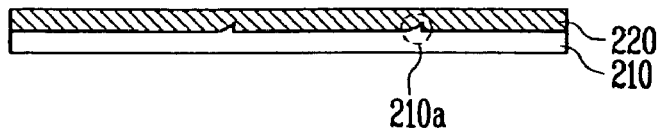
FIGS. 3A to 3D are cross-sectional views showing a fabrication process of the organic light emitting display device of FIG. 2 according to one embodiment.

FIGS. 3A to 3D are cross-sectional views showing the steps of the fabrication process of the organic light emitting display device shown in FIG. 2. Referring to FIGS. 3A to 3D, in order to fabricate the organic light emitting display device, a planarization process such as a CMP process or a super milling process for planarizing the substrate 210 made of a metal such as SUS is performed first. Then, a metal thin film 220 is formed on the substrate 210 so as to cover protrusions 210a remaining even after the planarization process. The metal thin film 220 may be formed of at least one selected from the group consisting of molybdenum (Mo), tungsten (W), a molybdenum-tungsten alloy (MoW), titanium (Ti), tantalum (Ta), invar, cobalt (Co), palladium (Pd), chromium (Cr), and an alloy of one or more of the foregoing. The metal thin film 220 may be formed by sputtering or CVD (chemical vapor deposition) to have a thickness of about 0.1 μm to about 1 μm (FIG. 3A).

Figure 3B:
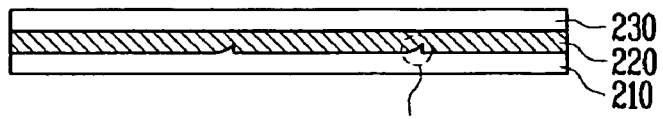

After the metal thin film 220 has been formed, the buffer layer 230 is formed on the metal thin film 220. The buffer layer 230 may include a single layer formed of a nitride layer or an oxide layer. The buffer layer 230 may have multiple sub-layers including a nitride layer and/or an oxide layer. (FIG. 3B)

Figure 3C:
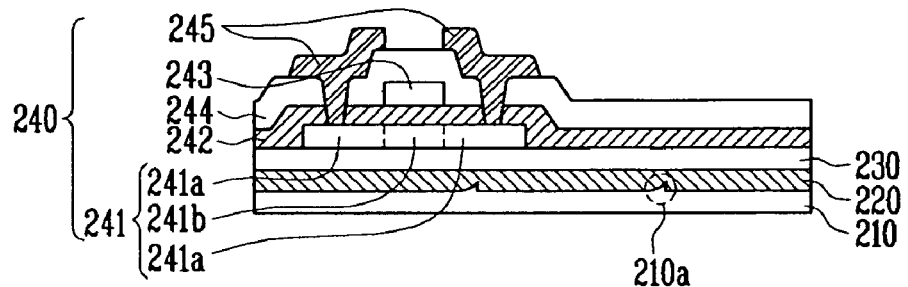

After the buffer layer 230 is formed, the thin film transistor 240 may be formed over the buffer layer 230. A process of forming the thin film transistor 240 includes the steps of: forming the semiconductor layer 241 over the buffer layer 230; forming the gate insulation layer 242 on the semiconductor layer 241; forming the gate electrode 243 on the gate insulation layer 242; forming source and drain regions 241a by doping at least one regions of the semiconductor layer 241 by using the gate electrode 243 as a mask; forming an interlayer insulation layer 244 on the gate electrode 243; forming the contact hole penetrating the gate insulation layer 242 and the interlayer insulation layer 244 to expose the source and drain area 241a; and forming the source and drain electrode 245 connected to the source and drain regions 241a through the contact hole on the interlayer insulation layer 244 (FIG. 3C).

After the thin film transistor 240 is formed, the planarization layer 250 may be formed over the thin film transistor 240. Next, a via hole penetrating the planarization layer 250 and exposing the drain electrode 245 of the thin film transistor 240 is formed.

Thereafter, a first electrode 262 of the organic light emitting diode 260 may be formed over the planarization layer 250 so as to be connected to the drain electrode 245 of the thin film transistor 240 through the via hole. A pixel definition layer 270 may be formed over the planarization layer 250 and the first electrode 262 so as to have an opening for exposing at least one area of the first electrode 262.

Figure 3D:
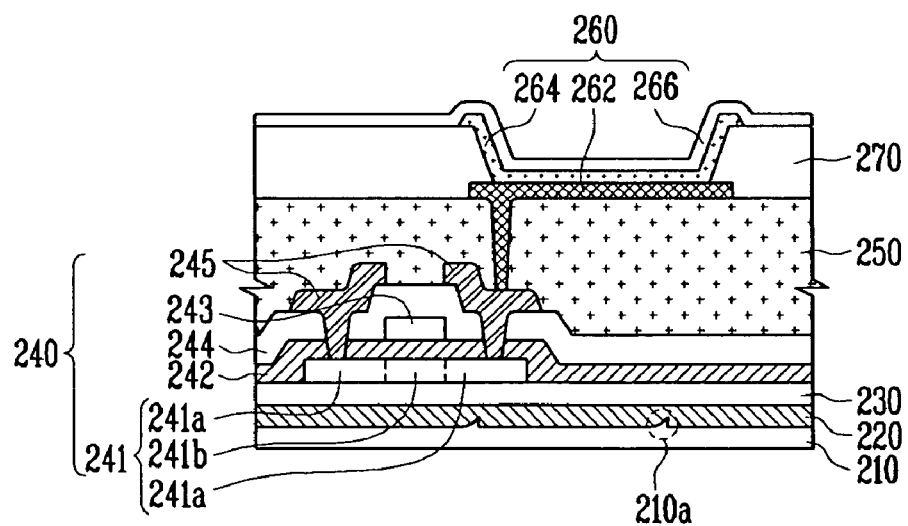

After the pixel definition layer 270 is formed, the organic light emitting layer 264 may be formed over the first electrode 262 of the organic light emitting diode 260, which is exposed through the opening of the pixel definition layer 270. A second electrode 266 of the organic light emitting diode 260 may be formed over the organic light emitting layer 264 (FIG. 3D).

Figure 4:
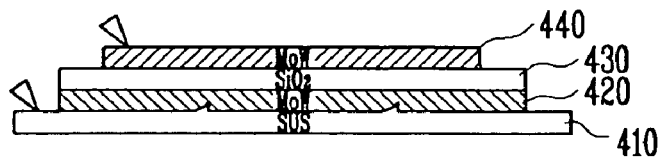
FIG. 4 is a cross-sectional view showing a stacked structure of a substrate, a metal thin film, a buffer layer, and a conductive layer, from which a resistance between the substrate and the conductive layer is measured.

FIG. 4 is a cross-sectional view showing a stacked structure of a substrate, a metal thin film, a buffer layer, and a conductive layer. A resistance between the substrate and the conductive layer may be measured from the stacked structure.

FIG. 4 is a schematic cross-sectional view of measuring electrical resistance between a substrate 410 and a buffer layer 430 of a stacked structure. A metal thin film interposed between the substrate and the buffer layer substantially prevents the separation of the buffer layer 430, and thus prevents an electrical short. In the illustrated embodiment, the substrate 410 is made of SUS. The buffer 430 is formed of $SiO_2$. The metal thin film 420 and the conductive layer 440 are formed of MoW. The metal thin film 420 and the buffer layer 430 have a thickness of 0.5 μm and 1 μm, respectively. A resistance between the substrate 410 and the conductive layer 440 is several kΩ to several hundreds MΩ, for example, about 4.9 kΩ to about 200 MΩ. The resistance is substantially greater than that of a similar stacked structure which has no metal thin film. The stacked structure without the metal thin film may have a resistance of a few tens Ω, for example, a resistance of below about 20Ω.

Therefore, it can be seen from this result that the metal thin film 420 prevents an electrical short between the substrate 410 and the conductive layer 440. In other words, the result represents that the buffer layer 430 formed between the substrate 410 and the conductive layer 440 effectively performs its insulating function due to the metal thin film 420. This reflects that separation of the buffer layer 430 has been prevented.

As mentioned above, the metal thin film 220 and 420 formed between the substrate 210 and 410 and the buffer layer 230 and 430 smoothly covers the surface of the substrate 210 and 420 and increases the adhesion between the substrate 210 and 410 and the buffer layer 230 and 430, thereby preventing the separation of the buffer layer 230 and 430. Therefore, a leakage current can be effectively prevented by preventing an electrical short between the substrate 210 and 410 and the devices or the wires formed over the buffer layer 230 and 430.

As mentioned above, according to the embodiments described above, the metal thin film provided between the substrate and the buffer layer can prevent separation of the buffer layer and an electrical short, thereby effectively reducing a leakage current.

Although certain embodiments have been shown and described, it would be appreciated by those skilled in the art that changes might be made in those embodiments without departing from the principles and spirit of the disclosure, the scope of which is defined in the claims and their equivalents.

What is claimed is:

1. An organic light emitting display device, comprising:
   a substrate formed of a metal;
   a metal thin film formed on the substrate;
   a buffer layer formed on the metal thin film; and
   an organic light emitting diode formed over the buffer layer.

2. The organic light emitting display device of claim 1, wherein the substrate is formed of a first metal, wherein the metal thin film is formed of a second metal, and wherein the first metal is different from the second metal.

3. The organic light emitting display device of claim 1, wherein the substrate is formed of SUS.

4. The organic light emitting display device of claim 1, wherein the buffer layer comprises at least one of a nitride layer and an oxide layer.

5. The organic light emitting display device of claim 1, wherein the metal thin film is formed of at least one selected from the group consisting of molybdenum (Mo), tungsten (W), a molybdenum-tungsten alloy (MoW), titanium (Ti), tantalum (Ta), invar (FeNi), cobalt (Co), palladium (Pd), chrome (Cr), and an alloy of one or more of the foregoing.

6. The organic light emitting display device of claim 1, wherein the substrate comprises a surface contacting the metal thin film, and wherein the substrate comprises at least one protrusion on the surface.

7. The organic light emitting display device of claim 1, wherein the metal thin film comprises a surface contacting the buffer layer, and wherein the surface of the metal thin film is planar.

8. The organic light emitting display device of claim 1, wherein the metal thin film has a thickness of about 0.1 μm to about 1 μm.

9. The organic light emitting display device of claim 1, wherein the substrate has a first thermal expansion coefficient, wherein the buffet layer has a second thermal expansion coefficient, and wherein the metal thin film has a third thermal expansion coefficient between the first and second thermal expansion coefficients.

10. The organic light emitting display device of claim 9, wherein the third thermal expansion coefficient of the metal thin film is about $1\times10^{-6}$ to about $13\times10^{-6}/°$ C.

11. The organic light emitting display device of claim 9, wherein the first thermal expansion coefficient is about $16\times10^{-6}$ to about $18\times10^{-6}/°$ C.

12. A method for fabricating an organic light emitting display device, the method comprising:
    forming a metal thin film on a substrate formed of a metal;
    forming a buffer layer on the metal thin film; and
    forming an organic light emitting diode over the buffer layer.

13. The method of claim 12, wherein the substrate is formed of a first metal, wherein the metal thin film is formed of a second metal, and wherein the first metal is different from the second metal.

14. The method of claim 12, wherein the substrate is formed of SUS.

15. The method of claim 12, wherein the metal thin film is formed of at least one selected from the group consisting of molybdenum (Mo), tungsten (W), a molybdenum-tungsten alloy (MoW), titan (Ti), tantalum (Ta), invar (FeNi), cobalt (Co), palladium (Pd), chrome (Cr), and an alloy of one or more of the foregoing.

16. The method of claim 12, wherein the metal thin film has a thickness of about 0.1 μm to about 1 μm.

17. The method of claim 12, wherein the metal thin film is formed by sputtering deposition or chemical vapor deposition.

18. The method of claim 12, further comprising planarizing a top surface of the substrate before forming the metal thin film on the top surface of the substrate.

19. The method of claim 18, wherein planarizing the top surface comprises using a chemical mechanical polishing or super milling process.

20. The method of claim 12, further comprising forming a thin film transistor or a wire over the buffer layer.

* * * * *